(12) United States Patent
Futatsuya

(10) Patent No.: US 7,519,943 B2
(45) Date of Patent: Apr. 14, 2009

(54) PHOTOMASK FABRICATION METHOD

(75) Inventor: Hiroki Futatsuya, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 121 days.

(21) Appl. No.: 11/507,523

(22) Filed: Aug. 22, 2006

(65) Prior Publication Data

US 2007/0198965 A1    Aug. 23, 2007

(30) Foreign Application Priority Data

Feb. 23, 2006  (JP) ............................ 2006-047254

(51) Int. Cl.
    G06F 17/50   (2006.01)
    G06F 19/00   (2006.01)
(52) U.S. Cl. .............. 716/21; 716/9; 716/10; 700/97; 700/120; 700/121
(58) Field of Classification Search .............. 716/21, 716/9, 10; 700/97, 120, 121
    See application file for complete search history.

(56) References Cited

U.S. PATENT DOCUMENTS

| 6,553,559 | B2* | 4/2003 | Liebmann et al. ........... 716/19 |
| 6,709,793 | B1* | 3/2004 | Brankner et al. ............ 430/5 |
| 6,777,146 | B1* | 8/2004 | Samuels ..................... 430/30 |
| 7,115,343 | B2* | 10/2006 | Gordon et al. .............. 430/5 |
| 7,181,721 | B2* | 2/2007 | Lippincott et al. ........... 716/21 |
| 7,382,912 | B2* | 6/2008 | Zhang ........................ 382/144 |
| 7,398,508 | B2* | 7/2008 | Shi et al. .................... 716/19 |
| 7,441,211 | B1* | 10/2008 | Gupta et al. ................ 716/2 |
| 2002/0150824 | A1* | 10/2002 | Park ........................... 430/5 |
| 2003/0118917 | A1* | 6/2003 | Zhang et al. ................ 430/5 |
| 2004/0006756 | A1* | 1/2004 | Zhang ........................ 716/19 |
| 2005/0149902 | A1* | 7/2005 | Shi et al. .................... 716/21 |
| 2006/0085773 | A1* | 4/2006 | Zhang ........................ 716/4 |
| 2006/0141368 | A1* | 6/2006 | Nam et al. .................. 430/5 |
| 2007/0037066 | A1* | 2/2007 | Hsiao ......................... 430/5 |
| 2007/0130558 | A1* | 6/2007 | Ivansen ...................... 716/19 |

FOREIGN PATENT DOCUMENTS

JP     2004-163472 A    6/2004

OTHER PUBLICATIONS

Goda et al., "Impact of RSF with Variable Coefficients for CD Variation Analysis Including OPC", 1999 4th International Workshop on Statistical Metrology, 1999, pp. 62-65.*

* cited by examiner

*Primary Examiner*—Phallaka Kik
(74) *Attorney, Agent, or Firm*—Westerman, Hattori, Daniels & Adrian, LLP.

(57) ABSTRACT

The simulation method is for simulating a pattern to be transferred onto a photoresist film by exposure using a photomask with a main pattern 10 and an assist pattern 12 formed on. The simulation is made, using data given by adding a bias value to a design dimension of the assist pattern as data of a dimension of the assist pattern. The simulation is made, using data given by adding a bias value to a design dimension of the assist pattern as data of a dimension of the assist pattern. The simulation can be made with high accuracy, and the fitting error can be made very small.

9 Claims, 13 Drawing Sheets

FIG. 8

| DESIGN DIMENSION OF ASSIST PATTERN (nm) | 40 | 50 | 60 | 70 |
|---|---|---|---|---|
| BIAS VALUE (nm) | 3 | 2 | 1 | 0 |

FIG. 10

|  | | DESIGN DIMENSION OF ASSIST PATTERN (nm) | | | |
| --- | --- | --- | --- | --- | --- |
|  | | 40 | 50 | 60 | 70 |
| GAP BETWEEN MAIN PATTERN AND ASSIST PATTERN (nm) | 70 | 3 | 2 | 1 | 0 |
| | 100 | 2 | 2 | 1 | 0 |
| | 120 | 1 | 1 | 0 | 0 |

FIG. 12

|  | DESIGN DIMENSION OF OPENING (nm) | | | |
| --- | --- | --- | --- | --- |
|  | 80 | 100 | 150 | 200 |
| BIAS VALUE OF FIRST OPENING (nm) | −6 | −5 | −4 | −3 |
| BIAS VALUE OF SECOND OPENING (nm) | −5 | −4 | −3 | −2 |

PHOTOMASK FABRICATION METHOD

CROSS-REFERENCE TO RELATED APPLICATION

This application is based upon and claims priority of Japanese Patent Application No. 2006-47254, filed on Feb. 23, 2006, the contents being incorporated herein by reference.

BACKGROUND OF THE INVENTION

The present invention relates to a simulation method and a semiconductor device fabrication method, more specifically, a simulation method which can improve the simulation accuracy and a semiconductor device fabrication method using the simulation method.

As LSI is increasingly highly integrated, and the size of the semiconductor element formed in the LSI is more micronized, the accuracy of transferring patterns in the photolithography steps is becoming significant.

For example, a phenomenon that although the corners are set rectangular in the design step, the corners are rounded when transferred to a photoresist film on a wafer takes place. A phenomenon that the width of the micronized interconnections becomes larger or smaller than a design value takes place. These phenomena are called an optical proximity effect.

As the patterns are increasingly micronized, the optical proximity effect becomes serious, and often the sizes of patterns after etched fail to satisfy the allowable dimensions.

Then, a technique for decreasing the influence of the optical proximity effect, i.e., the OPC (Optical Proximity effect Correction) is noted. The OPC is a technique for correcting in advance a photomask to be used in the photolithography step so as to null such dimensional variation.

Recently, a technique for simulating patterns of an actually designed photomask on a wafer (photoresist film) when the photomask is transferred to the wafer is proposed.

If the simulation can be accurately made, the design efficiency can be improved.

Following references disclose the background art of the present invention.

[Patent Reference 1]
Specification of Japanese Patent Application unexamined Publication No. 2004-163472

However, the proposed simulation technique cannot always make the simulation with sufficiently high accuracy, and some error (fitting error) takes place between actually measured values of patterns given by transferring an actually designed photomask to a wafer (photoresist film) and computed values given by simulation.

SUMMARY OF THE INVENTION

An object of the present invention is to provide a simulation method which can realized simulation with high accuracy, and a semiconductor device fabrication method using the simulation method.

According to one aspect of the present invention, there is provided a simulation method for simulating a pattern to be transferred onto a photoresist film by exposure using a photomask with a main pattern and an assist pattern formed on, the simulation being made, using data given by adding a bias value to a design dimension of the assist pattern as data of a dimension of the assist pattern.

According to another aspect of the present invention, there is provided a simulation method for simulating patterns transferred onto a photoresist film by exposure using a Levenson-type phase shift mask having a first opening and a second opening provided with phase shifter alternately laid out, pattern to be transferred onto the photoresist film being simulated, using data given by adding a first bias value to data of a design dimension of the first opening as data of a dimension of the first opening, and data given by adding a second bias value to a design dimension of the second opening as data of a dimension of the second opening.

According to further another aspect of the present invention, there is provided a semiconductor device fabrication method in which a simulation method for simulating a pattern to be transferred onto a photoresist film by exposure using a photomask with a main pattern and an assist pattern formed in, wherein data given by adding a bias value to a design dimension of the assist pattern is used as data of the dimension of the assist pattern in optical proximity effect correction.

According to the present invention, the simulation is made, using data given by adding a bias value to a design dimension of an assist pattern as data of a dimension of the assist pattern to make the simulation, whereby the simulation can be made with high accuracy, and the fitting error can be made very small.

According to the present invention, the simulation method described above is used in the OPC (Optical Proximity effect Correction), whereby micronized interconnection patterns, etc. can be formed efficiently with a desired accuracy. Thus, according to the present invention, micronized semiconductor devices of high performance can be fabricated with high yields.

BRIEF DESCRIPTION OF THE DRAWINGS

FIG. 8 is a view of a data table of the bias value.

FIG. 10 is a view of a data table of the bias value (Part 2).

FIG. 12 is a view of a data table of the bias value (Part 3).

DETAILED DESCRIPTION OF THE INVENTION

[Principle of the Invention]

Figure 1:
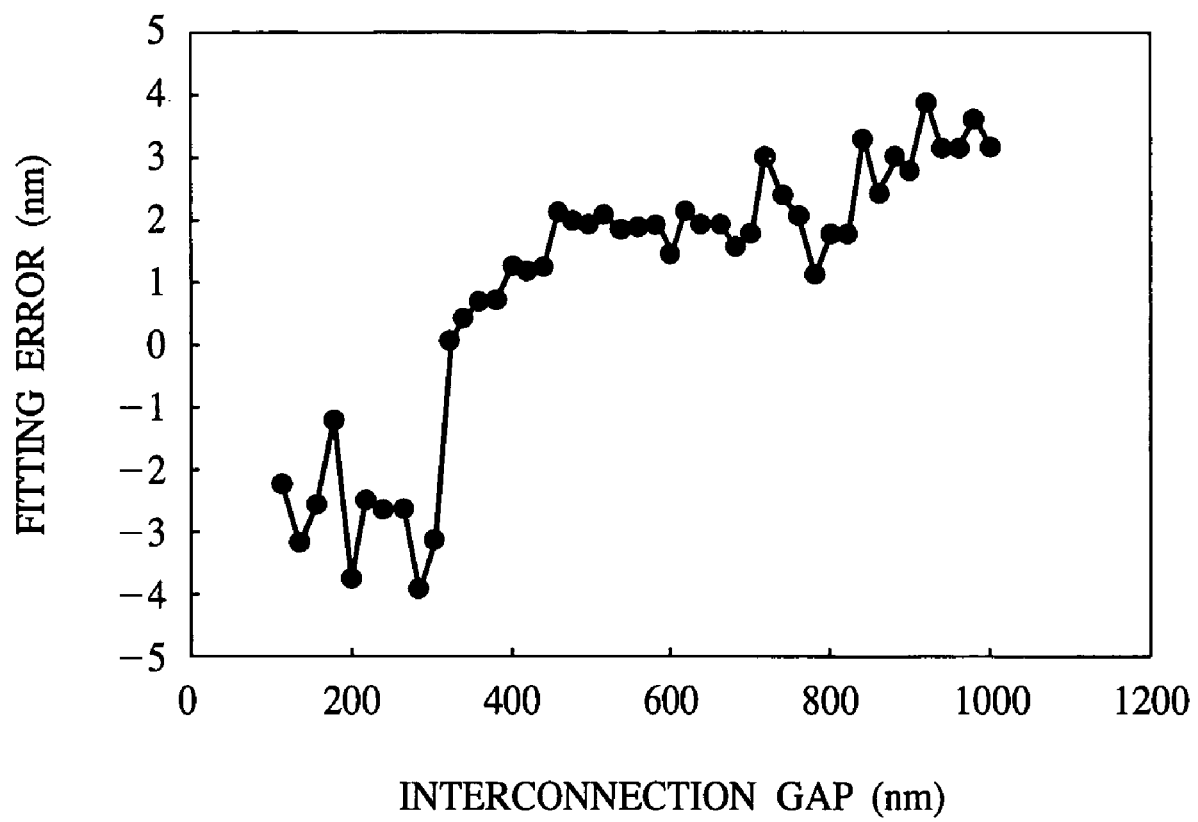
FIG. 1 is a graph of the relationship between the interconnection gap and the fitting error.

FIG. 1 is the graph of the relationship between the interconnection gap and the fitting error. In FIG. 1, on the horizontal axis, a gap between a main pattern and a main pattern, i.e., a gap between patterns actually used as interconnections is taken. The values in FIG. 1 are values on a wafer (photoresist film). In FIG. 1, on the vertical axis, a value (fitting error) given by subtracting a computed value (value given by the simulation) from an actually measured value of a pattern transferred to a wafer (photoresist film) is taken. In the measurement of FIG. 1, the width of the patterns of the interconnections was, e.g., about 80 nm on the wafer (photoresist film).

As seen in FIG. 1, when an interconnection gap on a wafer is 350 nm or larger than 350 nm, the fitting error tends to be much larger. Also as seen in FIG. 1, when the interconnection gap is 450 nm or above, the fitting error tends to be further larger.

Figure 2A:
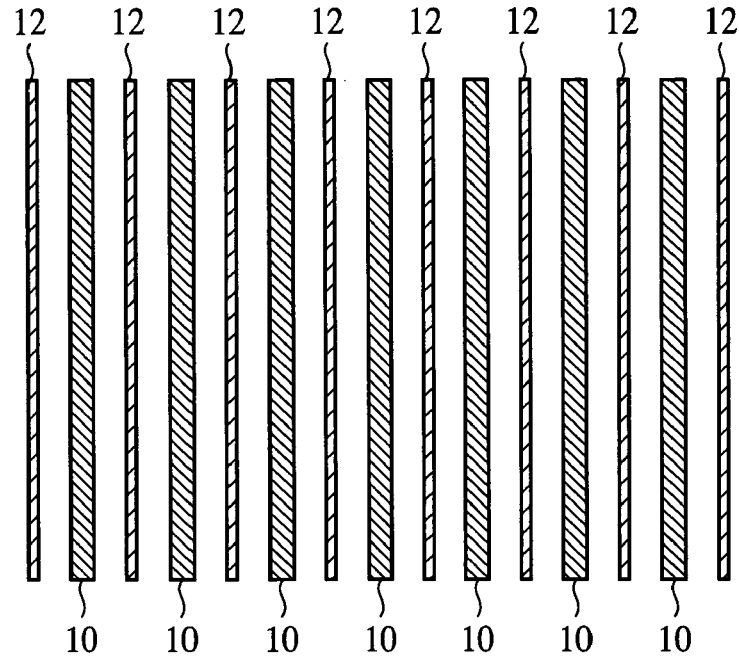
FIGS. 2A and 2B are plan views of patterns formed on a photomask (Part 1).
Figure 2B:
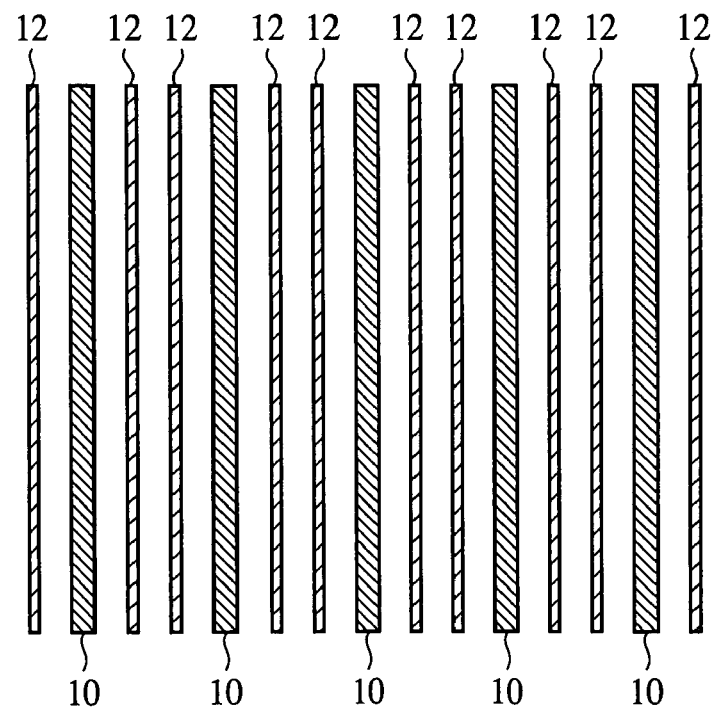

FIGS. 2A and 2B are plan views of patterns formed on the photomask. FIG. 2A is a plan view of the layout of the patterns when the interconnection gap is in the range of about 350 nm to 450 nm. As illustrated in FIG. 2A, assist patterns (assist bars, scattering bars) 12 are laid out each between the main patterns 10. FIG. 2B is a plan view of the layout of the patterns when the interconnection gap is 450 nm or above. As illustrated in FIG. 2B, assist patterns 12 are laid out two between the main patterns 10.

Based on the above, it is found that when the assist patterns 12 are formed between the main patterns 10, the fitting error is large, and besides, a plurality of the assist patterns 12 are formed between the main patterns 10, the fitting error is larger.

As factors for causing the fitting error, the following 2 factors will be considered.

The first factor is the error between dimensions of the assist patterns formed on an actual photomask and data of dimensions of the assist patterns recognized by the simulator. That is, the main patterns, which must be transferred to a wafer, are formed in a relatively large width, and the assist patterns, which must not be transferred to the water, are formed in a relatively small width. When an ArF excimer laser or others, whose wavelength is relatively short, is used as the exposure light source, the width of the assist patterns 12 is about 160 nm on the photomask while the wavelength of the ArF excimer laser is about 193 nm. The assist patterns are not to be transferred to a phototresist film and have the substantially same width as the a wavelength of the exposure light source or a width shorter than the wavelength of the exposure light source. This makes it difficult for the assist patterns to be formed well on a photomask as in a design value. When dimensions of the assist patterns formed on an actual photomask, and data of dimensions of the assist patterns recognized by the simulator are thus different from each other, this is a factor for causing the fitting error.

The second factor will be the electromagnetic phenomenon occurring in the surface of a photomask.

Figure 3:
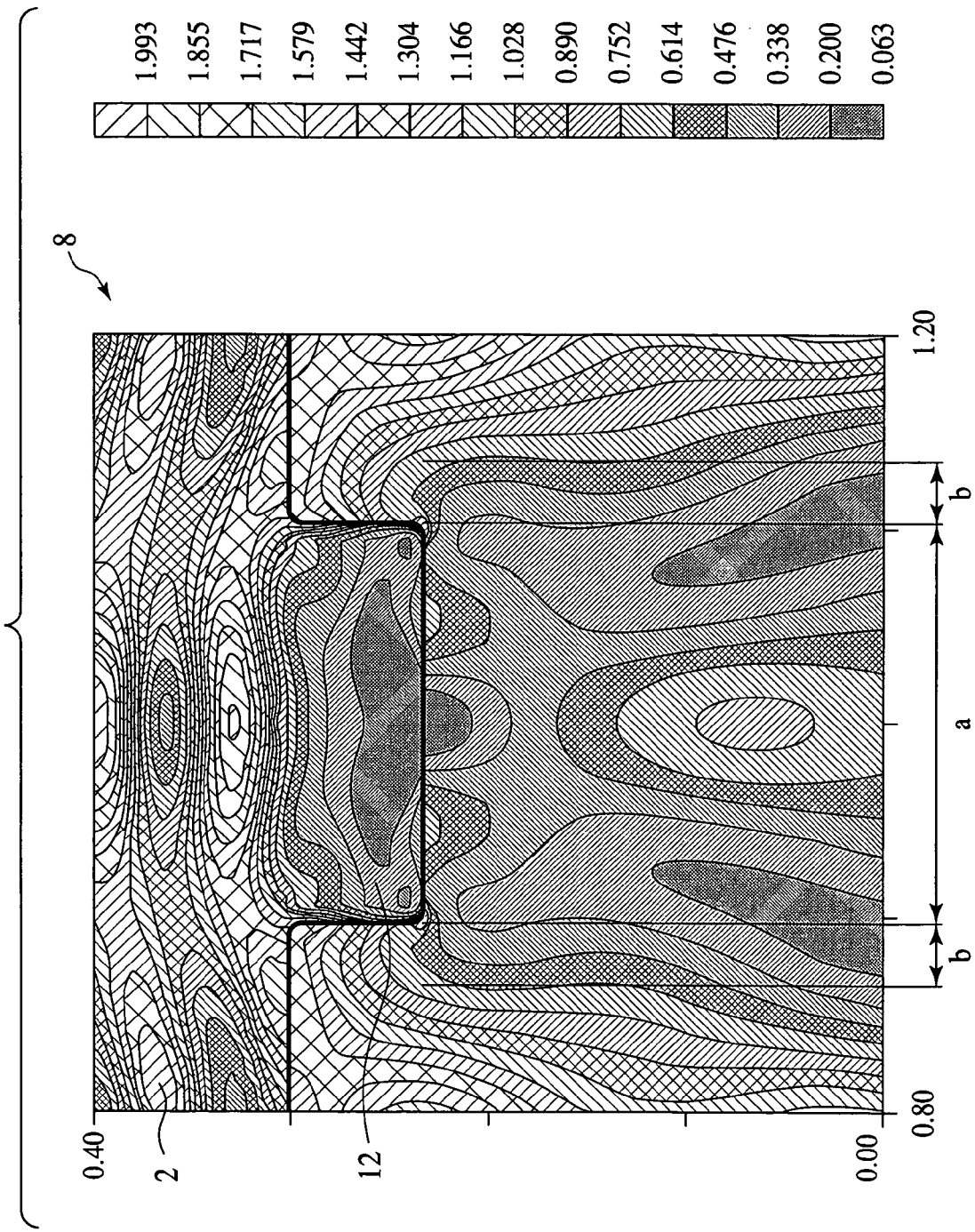
FIG. 3 is a conceptual view of the electromagnetic phenomenon occurring in the surface of the photomask.

FIG. 3 is a conceptual view of the electromagnetic phenomenon occurring in the surface of a photomask. FIG. 3 is a conceptual view of the strength distribution of the electric field given when exposure light is applied to the photomask. When ArF excimer laser of, e.g., a 193 nm-wavelength was applied from above as viewed in FIG. 3, the strength distribution of the electric field in the photomask 8 was as shown in FIG. 3. To give the strength distribution of the electric field shown in FIG. 3 by the simulation, the refractive index of a substrate 2 was 1.5, the refractive index of the light shielding part (assist pattern) 12 was 4.34+0.59i, and the refractive index of air was 1. The width a of the light shielding part 12 was 200 nm.

As seen in FIG. 3, it is idealistic that the light is intercepted in the regions where the light shielding parts 12 are present and is sufficiently transmitted in the region where the light shielding parts 12 are not present.

However, as shown in FIG. 3, also near the light shielding parts 12, regions b where the electric field strength is relatively low, and the light is not sufficiently transmitted are present. The width of these regions b will be formed on both sides of the light shielding parts 12 in an about 20 nm-range on the photomask 8. In the reduction exposure of 4:1, the width of such regions b are present on the sides of the patterns in an about 5 nm-range on the wafer. The generation of such region b where the transmission of the light is thus prevented to some extent will be due to the electromagnetic phenomenon occurring in the surface of the photomask 8. This electromagnetic phenomenon is also a factor for the fitting error.

When the simulation is made without taking these phenomena into account, some fitting error takes place.

The inventor of the present application made earnest studies and has obtained the idea that the simulation is made by using data given by adding a bias value to data of design dimensions of the assist patterns as data of the dimension of the assist patterns, whereby the fitting error can be made small. A bias value is added to data of design dimensions of the assist patterns only when the simulation is made, and patterns of an actual photomask are formed based on a design value.

A FIRST EMBODIMENT

Figure 4:
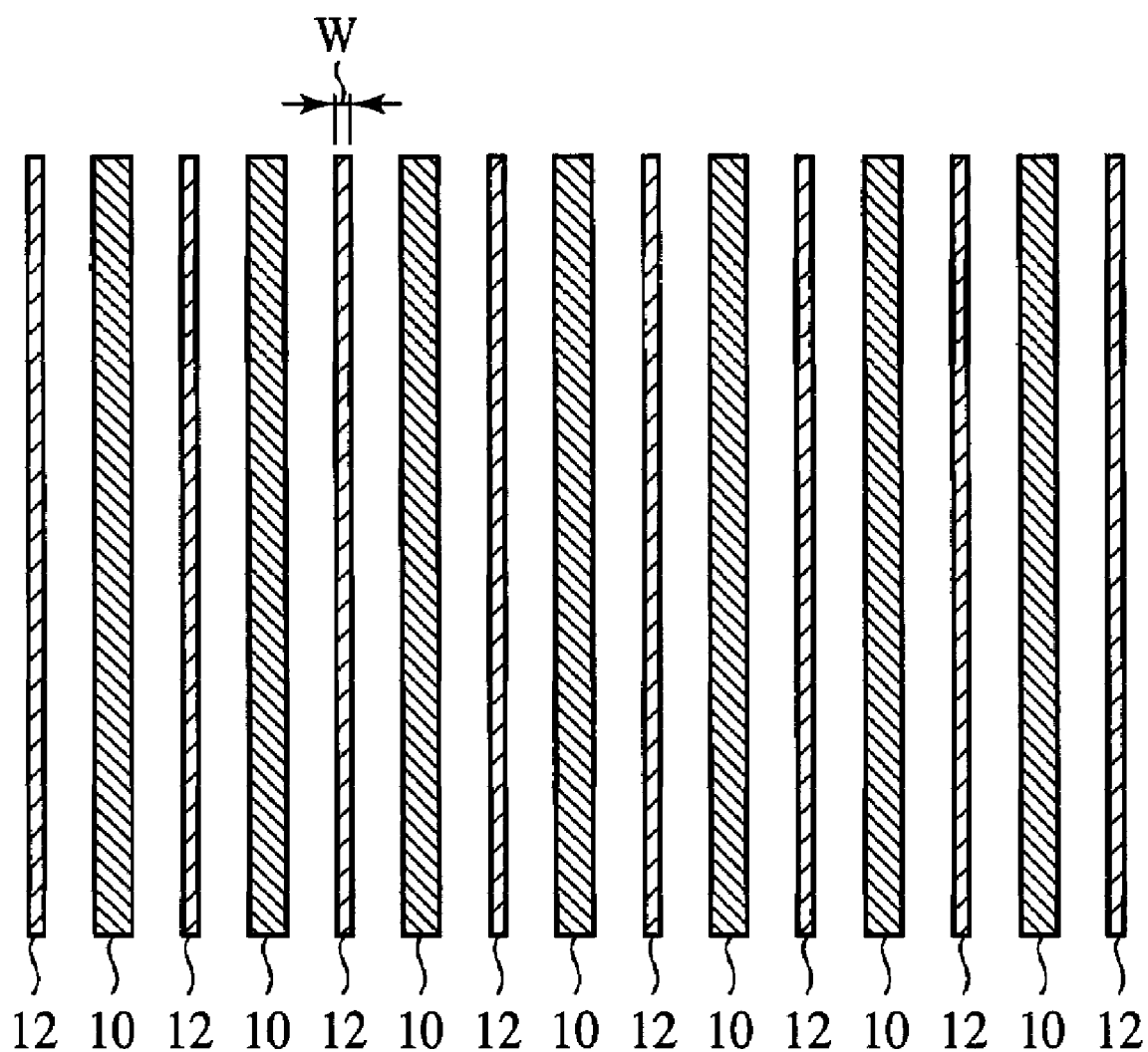
FIG. 4 is a plan view of patterns formed on a photomask (Part 2).

The simulation method according to a first embodiment of the preset invention will be explained with reference to FIGS. 4 and 5. FIG. 4 is a plan view of patterns formed on a photomask.

As illustrated in FIG. 4, assist patterns are laid out one between main patterns. A design value W of the assist patterns is, e.g., 40 nm on a wafer. For the reduction exposure of 4:1, a design value W of the dimension of the assist patterns is, e.g., 160 nm on the photomask.

However, the simulation is made, using data of a design value as the data of the assist patterns, it is difficult to make the simulation of sufficiently small fitting error.

Then, in the present embodiment, when the patterns to be transferred to a wafer (photoresist film) are simulated, a value W1' given by adding a bias value to a design value W1 of the dimension of the assist patterns 12 is used as data of the dimension of the assist patterns to be used in the simulation.

Such bias value can be given by, e.g., simulation.

Such bias value is expressed by $$W' = W + 2 \times B \tag{1}$$

where a design value of the dimension of the assist patterns is W, data of the dimension of the assist patterns used in the simulation is W1', and a bias value on one side of the patterns is B. When a value of the design value W of the assist patterns is, e.g., 40 nm, a value of bias value B is, e.g., 3 nm, a value of the data W' of the dimension of the assist patterns used in the simulation is, e.g., 46 nm.

The value doubling the bias value B on one side of the assist patterns is added here to the design value W of the dimension of the assist patterns. Data of a bias value prepared in advance is not essentially data of a bias value on one side. A value doubling in advance a bias value B on one side may be used as a bias value.

As described above, a value of the bias value B is given by, e.g., simulation or others. The data of the bias value B is stored in a hard disc device (memory device) or others of a simulator or others.

In the simulation, data W' given by adding a bias value B to data W of a design value of the assist patterns 12 is used as data of the assist patterns 12 to make the simulation.

Figure 5:
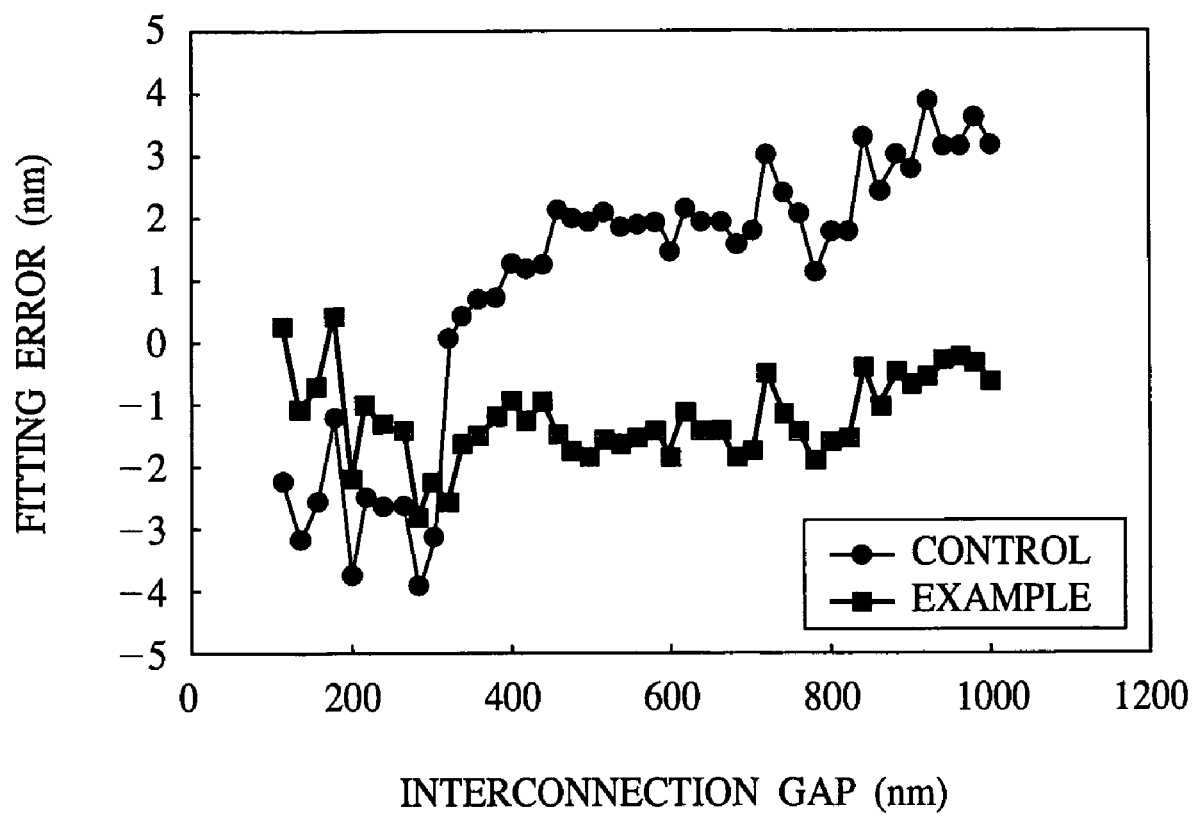
FIG. 5 is a graph of the relationship between the interconnection gap and the fitting error.

FIG. 5 is a graph of the relationship between the interconnection gap and the fitting error. The interconnection gap, i.e., the gap between the main patterns is taken on the horizontal axis. On the vertical axis, the fitting error, i.e., values given by subtracting computed values (simulation results) from actually measured values are taken. In FIG. 5, the ● marks indicate a control where the simulation was made, using, i.e., data of dimensions of design values of the assist patterns 12. The ■ marks indicate the present embodiment where the simulation was made by using, i.e., data given by adding bias values to data of design dimensions of assist patterns 12 as data of the assist patterns 12.

As seen in FIG. 5, in the case indicated by the ● marks, where the simulation was made, using, i.e., the data of the dimensions of the design values of the assist patterns 12, the fitting error is considerably large.

In contrast to this, in the present embodiment, where the simulation was made by using, i.e., data given by adding bias values to design dimensions of the assistant patterns as data of the dimensions of the assistant patterns, the fitting error is considerably small.

As described above, according to the present embodiment, the simulation is made, using data given by adding a bias value to a design dimension of the assistant patterns as data of the dimension of the assistant patterns, whereby the simulation can be made with high accuracy, and the fitting error can be made very small.

A SECOND EMBODIMENT

Figure 6:
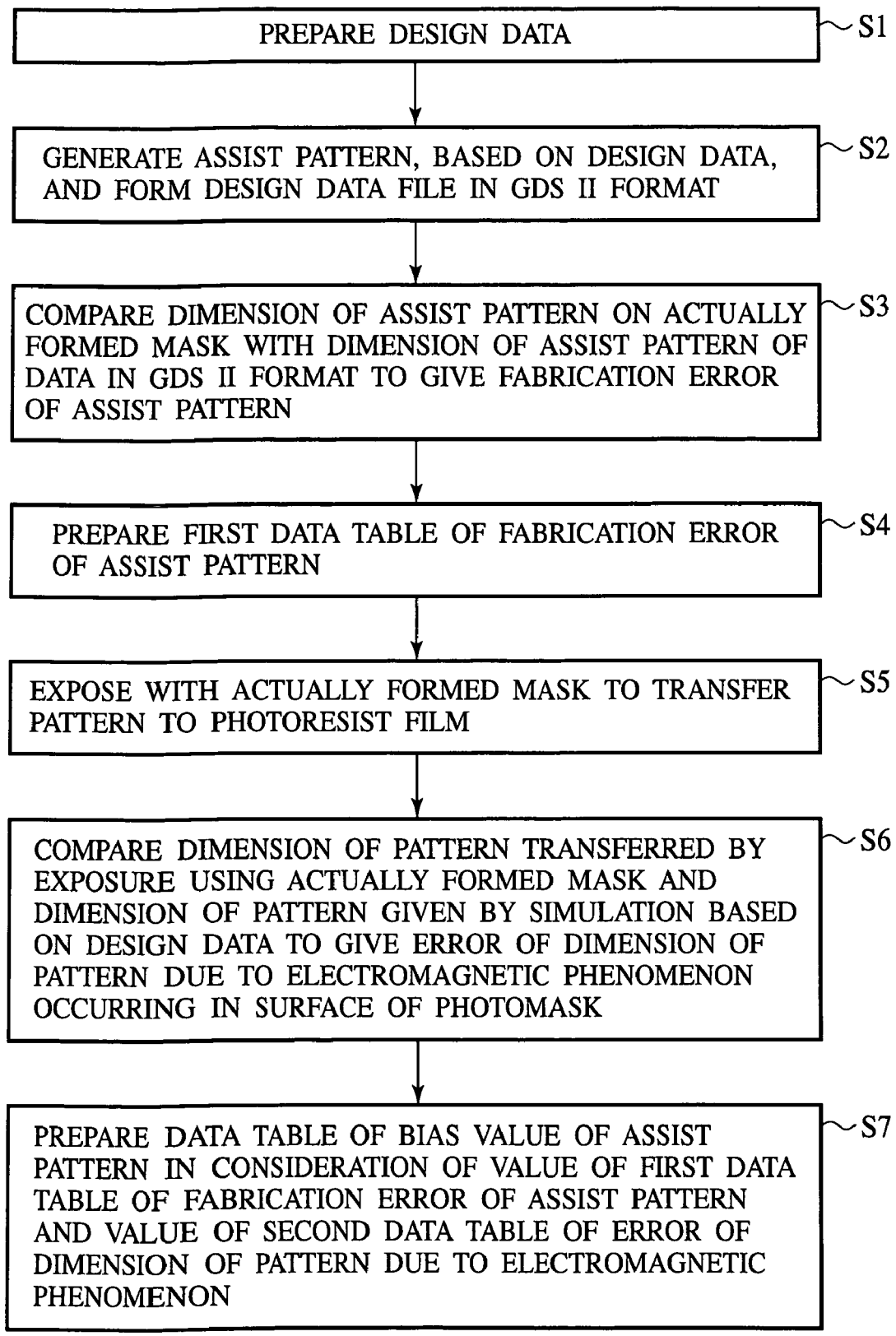
FIG. 6 is the flow chart of forming a data table.
Figure 7:
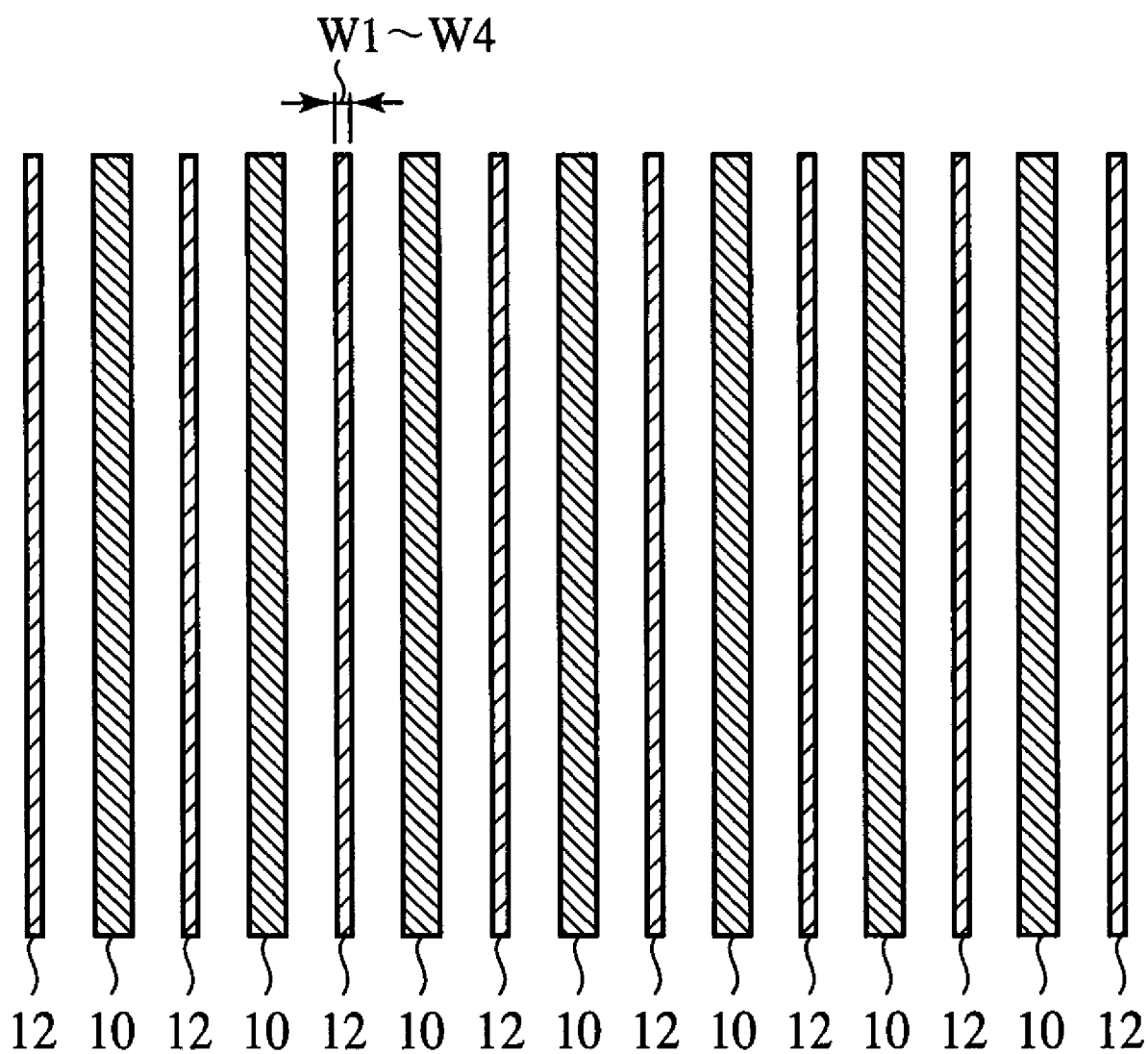
FIG. 7 is a plan view of the patterns formed on a photomask (Part 3).

The simulation method according to a second embodiment of the present invention will be explained with reference to FIGS. 6 to 8. FIG. 6 is the flow chart of the method of forming a data table according to the present embodiment. FIG. 7 is a plan view of patterns formed on a photomask. FIG. 8 is a view of a data table of bias values. The same members of the present embodiment as those of the simulation method according to the first embodiment illustrated in FIGS. 1 to 5 are represented by the same reference numbers not to repeat or to simplify their explanation.

The simulation method according to the present embodiment is characterized mainly in that bias values for forming data for the simulation are set corresponding to dimensions of assistant patterns 12.

When the assist patterns 12 do not have a uniform dimension and have various dimensions, errors between design values of the assist patterns 12 and dimensions of the actually formed assist patterns 12 have various values corresponding to the dimensions of the assistant patterns 12. In such case, the electromagnetic phenomenon occurring in the surface of the photomask occurs in various scales. Accordingly, different bias values are set for the dimensions of the assist patterns 12.

First, a data table of bias values corresponding to dimensions of the assist patterns 12 is given by simulation or others as exemplified below.

As illustrated in FIG. 6, design data is prepared (Step S1).

Then, assist patterns are generated based on the design data to form a design data file in GDS II format (Step S2).

Next, a mask is prepared based on the data (design data) of the file in GDS II format (see FIG. 7).

Then, a dimension of the assist patterns of an actually formed mask, and a dimension of the assist patterns of the GDS II data are compared with each other to give a fabrication error of the assist patterns (Step S3).

Then, the first data table of the fabrication error of the assist patterns is prepared (Step S4). The first data table of the fabrication error of the assist patterns is prepared for, e.g., respective dimensions of the assist patterns.

Next, exposure is made, using the actually formed mask to thereby transfer the patterns to a photoresist (Step S5).

Then, the dimension of the patterns transferred by the exposure using the actually formed mask, and a dimension of the patterns given by the simulation based on the design data are compared with each other to thereby give an error of a dimension of the patterns due to the electromagnetic phenomenon occurring in the surface of the photomask (Step S6) The second data table of the error of such patterns is prepared for respective dimensions of the assist patterns.

Next, in taking into account the values of the first data table of the fabrication error of the assist patterns given as above, and the values of the second data table of the error of the dimension of the patterns due to the electromagnetic phenomenon, a final data table of the bias value of the assist patterns is prepared (Step S7).

Bias values are thus given corresponding to design values of the dimension of the assist patterns 12. The data of the thus given bias values are stored as a data table in, e.g., the hard disc device of the simulator.

The simulation may be made, varying various parameters finely or relatively roughly in a certain range.

Thus, bias value corresponding to a design value of the dimension of the assist patterns 12 is given by the simulation.

FIG. 8 is a view of the data table of the bias value.

As shown in FIG. 8, when a design value W1 of the dimension of the assist patterns 12 is, e.g., 40 nm, the bias value B1 is, e.g., 3 nm. When a design value W2 of the dimension of the assist patterns 12 is, e.g. 50 nm, the bias value B2 is, e.g., 2 nm. When a design value W3 of the dimension of the assist patterns 12 is, e.g., 60 nm, the bias value B3 is, e.g., 1 nm. When a design value W4 of the dimension of the assist patterns 12 is, e.g., 70 nm, the bias value B4 is, e.g., 0 nm.

As shown in FIG. 8, as the design dimension (width) of the assist patterns 12 becomes smaller, the bias value becomes larger.

Next, the simulation is made, using data given by adding the bias value to the design dimension of the assist patterns 12 as data of the dimension of the assist patterns 12. That is, it is given by the simulation what patterns will be formed on the wafer 12 when the patterns are transferred to the wafer (photoresist film) 12, using the actually formed photomask.

When a design value of the dimension of the assist patterns 12 is W1, a value W1' given by adding a bias value B1 to the design value W1 of the dimension of the assist patterns is used as data of the dimension of the assist patterns 12 in the simulation. Such data W1' is expressed by $$W1' = W1 + 2 \times B1 \tag{2}$$

As shown in FIG. 8, when a value of the dimension W1 of the assist patterns 12 is, e.g., 40 nm, the value of the bias value B1 is, e.g., 3 nm, based on the result of the above simulation, and the value of W1' is, e.g., 46 nm.

When a design value of the dimension of the assist patterns 12 is W2, a value W2' given by adding a bias value B2 to the design value W2 of the dimension of the assist patterns 12 is used as data of the dimension of the assist patterns 12 in the simulation. Such data W2' is expressed by $$W2' = W2 + 2 \times B2 \tag{3}$$

As shown in FIG. 8, when a value of the dimension W2 of the assist patterns 12 is, e.g., 50 nm, the value of the bias value B2 is, e.g., 2 nm, based on the result of the above simulation, and the value of W2' is, e.g., 54 nm.

When a design value of the dimension of the assist patterns 12 is W3, a value W3' given by adding a bias value B3 to the design value W3 of the dimension of the assist patterns 12 is used as data of the dimension of the assist patterns 12 in the simulation. Such data W3' is expressed by $$W3'=W3+2\times B3 \qquad (4).$$

As shown in FIG. 8, when a value of the dimension W3 of the assist patterns 12 is, e.g., 60 nm, the value of the bias value B3 is, e.g., 1 nm, based on the result of the above simulation, and the value of W3' is, e.g., 62 nm.

When a design value of the dimension of the assist patterns 12 is W4, a value W4' given by adding a bias value B4 to the design value W4 of the dimension of the assist patterns 12 is used as data of the dimension of the assist patterns 12 in the simulation. Such data W4' is expressed by $$W4'=W4+2\therefore B4 \qquad (5).$$

As shown in FIG. 8, when a value of the dimension W4 of the assist patterns 12 is, e.g., 70 nm, the value of the bias value B4 is, e.g., 0 nm, based on the result of the above simulation, and the value of W4' is, e.g., 70 nm.

The simulation is thus made, using data given by adding a bias value to data of a design dimension of the assist patterns 12 as data of the assist patterns 12, and patterns to be transferred to a wafer (photoresist film) are given.

According to the present embodiment, the simulation is made, using data given by adding the bias value to the design dimension of the assist patterns 12 as data of the dimension of the assist patterns, whereby the simulation can be made with high accuracy, and the fitting error can be made very small.

A THIRD EMBODIMENT

Figure 9:
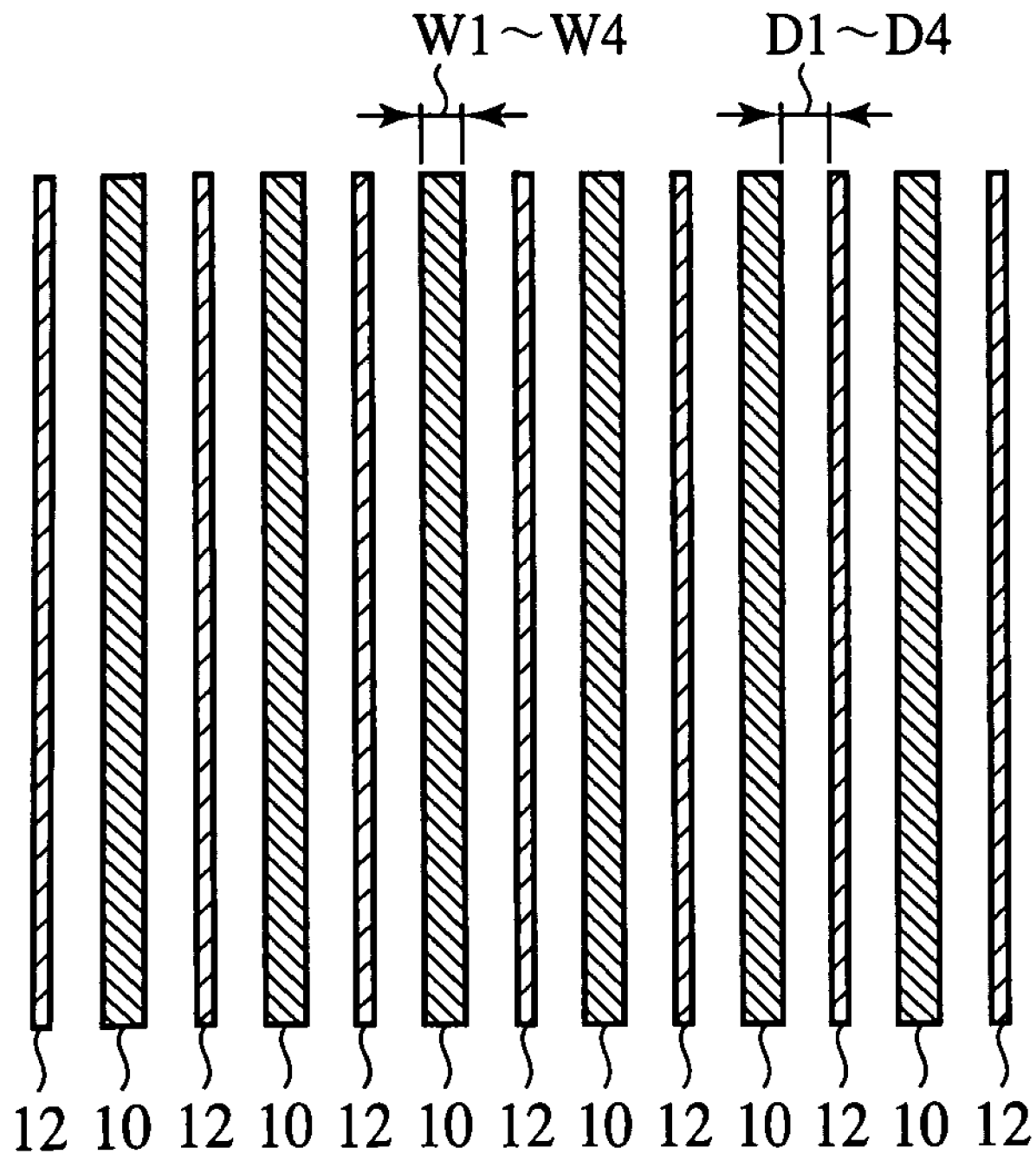
FIG. 9 is a plan view of patterns formed on a photomask (Part 4).

The simulation method according to a third embodiment of the present invention will be explained with reference to FIGS. 9 to 10. FIG. 9 is a plan view of patterns formed on a photomask. FIG. 10 is a view of a data table of the bias value. The same members of the simulation method according to the present embodiment as those of the simulation method according to the first or the second embodiment are represented by the same reference numbers not to repeat or to simplify their explanation.

The simulation method according to the present embodiment is characterized mainly in that the bias value forming the data for the simulation is formed corresponding to a dimension of the assist patterns 12 and also corresponding to a gap between the assist patterns 12 and main patterns 10.

When the assist patterns 12 do not have a uniform dimension and various dimensions, errors between design values of the assist patterns 12 and the actually formed assist patterns 12 have various values depending on the dimensions of the assist patterns 12. When the assist patterns 12 and main patterns 10 do not have a uniform dimension and various dimensions, the electromagnetic phenomenon occurring in the surface of the photomask 8 has various scales. Also, when the gap between the assist patterns 12 and the main patterns 10 is not uniform and various, it is a factor for increasing the fitting error. In such case, the bias value is varied corresponding to dimensions of the assist patterns 12 and also corresponding to gaps between the assist patterns 12 and the main patterns 10.

A bias value corresponding to a dimension of the assist patterns 12 is given by, e.g., the simulation as follows. This simulation can be made in substantially the same manner as the simulation of the second embodiment described above.

For example, when the design value of the dimension of the assist patterns 12 is W1, and the gap between the assist patterns 12 and the main patterns 10 is D1, the bias B11 is given by, e.g., the simulation. FIG. 10 is a view of the data table of bias values. As shown in FIG. 10, the bias value B11 is, e.g., 3 nm when the design value W1 of the dimension of the assist patterns 12 is, e.g., 40 nm, and the gap between the assist patterns 12 and the main patterns 10 is 70 nm.

When the design value of the dimension of the assist patterns 12 is W2, and the gap between the assist patterns 12 and the main patterns 10 is D1, the bias B21 is given by, e.g., the simulation. As shown in FIG. 10, the bias value B21 is, e.g., 2 nm when the design value W2 of the dimension of the assist patterns 12 is, e.g., 50 nm, and the gap between the assist patterns 12 and the main patterns 10 is 70 nm.

When the design value of the dimension of the assist patterns 12 is W3, and the gap between the assist patterns 12 and the main patterns 10 is D1, the bias B31 is given by, e.g., the simulation. As shown in FIG. 10, the bias value B31 is, e.g., 1 nm when the design value W3 of the dimension of the assist patterns 12 is, e.g., 60 nm, and the gap between the assist patterns 12 and the main patterns 10 is 70 nm.

When the design value of the dimension of the assist patterns 12 is W4, and the gap between the assist patterns 12 and the main patterns 10 is D1, the bias B41 is given by, e.g., the simulation. As shown in FIG. 10, the bias value B41 is, e.g., 0 nm when the design value W4 of the dimension of the assist patterns 12 is, e.g., 70 nm, and the gap between the assist patterns 12 and the main patterns 10 is 70 nm.

When the design value of the dimension of the assist patterns 12 is W1, and the gap between the assist patterns 12 and the main patterns 10 is D2, the bias B12 is given by, e.g., the simulation. As shown in FIG. 10, the bias value B12 is, e.g., 2 nm when the design value W1 of the dimension of the assist patterns 12 is, e.g., 40 nm, and the gap between the assist patterns 12 and the main patterns 10 is 100 nm.

When the design value of the dimension of the assist patterns 12 is W2, and the gap between the assist patterns 12 and the main patterns 10 is D2, the bias B22 is given by, e.g., the simulation. As shown in FIG. 10, the bias value B22 is, e.g., 2 nm when the design value W2 of the dimension of the assist patterns 12 is, e.g., 50 nm, and the gap between the assist patterns 12 and the main patterns 10 is 100 nm.

When the design value of the dimension of the assist patterns 12 is W3, and the gap between the assist patterns 12 and the main patterns 10 is D2, the bias B32 is given by, e.g., the simulation. As shown in FIG. 10, the bias value B32 is, e.g., 1 nm when the design value W3 of the dimension of the assist patterns 12 is, e.g., 60 nm, and the gap between the assist patterns 12 and the main patterns 10 is 100 nm.

When the design value of the dimension of the assist patterns 12 is W4, and the gap between the assist patterns 12 and the main patterns 10 is D2, the bias B42 is given by, e.g., the simulation. As shown in FIG. 10, the bias value B42 is, e.g., 0 nm when the design value W4 of the dimension of the assist patterns 12 is, e.g., 70 nm, and the gap between the assist patterns 12 and the main patterns 10 is 100 nm.

When the design value of the dimension of the assist patterns 12 is W1, and the gap between the assist patterns 12 and the main patterns 10 is D3, the bias B13 is given by, e.g., the simulation. As shown in FIG. 10, the bias value B13 is, e.g., 1 nm when the design value W1 of the dimension of the assist patterns 12 is, e.g., 40 nm, and the gap between the assist patterns 12 and the main patterns 10 is 120 nm.

When the design value of the dimension of the assist patterns 12 is W2, and the gap between the assist patterns 12 and the main patterns 10 is D3, the bias B23 is given by, e.g., the simulation. As shown in FIG. 10, the bias value B23 is, e.g., 1 nm when the design value W2 of the dimension of the assist patterns 12 is, e.g., 50 nm, and the gap between the assist patterns 12 and the main patterns 10 is 120 nm.

When the design value of the dimension of the assist patterns 12 is W3, the gap between the assist patterns 12 and the main patterns 10 is D3, the bias B33 is given by, e.g., the simulation. As shown in FIG. 10, the bias value B33 is, e.g., 0 nm when the design value W3 of the dimension of the assist patterns 12 is, e.g., 60 nm, and the gap between the assist patterns 12 and the main patterns 10 is 120 nm.

When the design value of the dimension of the assist patterns 12 is W4, and the gap between the assist patterns 12 and the main patterns 10 is D3, the bias B43 is given by, e.g., the simulation. As shown in FIG. 10, the bias value B43 is, e.g., 0 nm when the design value W4 of the dimension of the assist patterns 12 is, e.g., 70 nm, and the gap between the assist patterns 12 and the main patterns 10 is 120 nm.

As shown in FIG. 10, as the design dimension (width) of the assist patterns 12 becomes smaller, the bias value becomes larger. As the gap between the main patterns 10 and the assist patterns 12 becomes smaller, the bias value becomes larger.

The data of the thus-given bias values B11 to B43 is stored as a data table in, e.g., the hard disc device of the simulator.

Then, the simulation is made, using data given by adding a bias value to a design dimension of the assist patterns 12 as data of the dimension of the assist patterns. That is, it is given by the simulation what patterns will be formed on a wafer when the patterns are transferred to the wafer (photoresist film) 12, using an actually prepared photomask.

For example, when a design value of the dimension of the assist patterns 12 is W1, and the gap between the assist patterns 12 and the main patterns 10 is D1, a value W11' given by adding a bias value B11 to the design value W1 of the dimension of the assist patterns 12 is used as data of the dimension of the assist patterns 12 in the simulation. The data W11' is expressed by $$W11'=W1+2\times B11 \qquad (6).$$

When the value of the design dimension W1 of the assist patterns 12 is 40 nm, and the gap D1 between the assist patterns 12 and the main patterns 10 is 70 nm, based on the above-described simulation result, the bias value B11 is, e.g., 3 nm, and the value of W11' is, e.g., 46 nm.

When a design value of the dimension of the assist patterns 12 is W2, and the gap between the assist patterns 12 and the main patterns 10 is D1, a value W21' given by adding a bias value B21 to the design value W1 of the dimension of the assist patterns 12 is used as data of the dimension of the assist patterns 12 in the simulation. The data W21' is expressed by $$W21'=W2+2\times B21 \qquad (7).$$

When the value of the design dimension W2 of the assist patterns 12 is 50 nm, and the gap D1 between the assist patterns 12 and the main patterns 10 is 70 nm, based on the above-described simulation result, the bias value B21 is, e.g., 2 nm, and the value of W21' is, e.g., 54 nm.

When a design value of the dimension of the assist patterns 12 is W3, and the gap between the assist patterns 12 and the main patterns 10 is D1, a value W31' given by adding a bias value B31 to the design value W3 of the dimension of the assist patterns 12 is used as data of the dimension of the assist patterns 12 in the simulation. The data W31' is expressed by $$W31'=W3+2\times B31 \qquad (8).$$

When the value of the design dimension W3 of the assist patterns 12 is 60 nm, and the gap D1 between the assist patterns 12 and the main patterns 10 is 70 nm, based on the above-described simulation result, the bias value B31 is, e.g., 1 nm, and the value of W31' is, e.g., 62 nm.

When a design value of the dimension of the assist patterns 12 is W4, and the gap between the assist patterns 12 and the main patterns 10 is D1, a value W41' given by adding a bias value B41 to the design value W4 of the dimension of the assist patterns 12 is used as data of the dimension of the assist patterns 12 in the simulation. The data W41' is expressed by $$W41'=W4+2\times B41 \qquad (9).$$

When the value of the design dimension W4 of the assist patterns 12 is 70 nm, and the gap D1 between the assist patterns 12 and the main patterns 10 is 70 nm, based on the above-described simulation result, the bias value B41 is, e.g., 0 nm, and the value of W41' is, e.g., 70 nm.

When a design value of the dimension of the assist patterns 12 is W1, and the gap between the assist patterns 12 and the main patterns 10 is D2, a value W12' given by adding a bias value B12 to the design value W1 of the dimension of the assist patterns 12 is used as data of the dimension of the assist patterns 12 in the simulation. The data W12' is expressed by $$W12'=W1+2\times B12 \qquad (10).$$

When the value of the design dimension W1 of the assist patterns 12 is 40 nm, and the gap D2 between the assist patterns 12 and the main patterns 10 is 100 nm, based on the above-described simulation result, the bias value B12 is, e.g., 2 nm, and the value of W12' is, e.g., 44 nm.

When a design value of the dimension of the assist patterns 12 is W2, and the gap between the assist patterns 12 and the main patterns 10 is D2, a value W22' given by adding a bias value B22 to the design value W2 of the dimension of the assist patterns 12 is used as data of the dimension of the assist patterns 12 in the simulation. The data W22' is expressed by $$W22'=W2+2\times B22 \qquad (11).$$

When the value of the design dimension W2 of the assist patterns 12 is 50 nm, and the gap D2 between the assist patterns 12 and the main patterns 10 is 100 nm, based on the above-described simulation result, the bias value B22 is, e.g., 2 nm, and the value of W22' is, e.g., 54 nm.

When a design value of the dimension of the assist patterns 12 is W3, and the gap between the assist patterns 12 and the main patterns 10 is D2, a value W32' given by adding a bias value B32 to the design value W2 of the dimension of the assist patterns 12 is used as data of the dimension of the assist patterns 12 in the simulation. The data W32' is expressed by $$W32'=W3+2\times B32 \qquad (12).$$

When the value of the design dimension W3 of the assist patterns 12 is 60 nm, and the gap D2 between the assist patterns 12 and the main patterns 10 is 100 nm, based on the above-described simulation result, the bias value B32 is, e.g., 1 nm, and the value of W32' is, e.g., 62 nm.

When a design value of the dimension of the assist patterns 12 is W4, and the gap between the assist patterns 12 and the main patterns 10 is D2, a value W42' given by adding a bias value B42 to the design value W2 of the dimension of the assist patterns 12 is used as data of the dimension of the assist patterns 12 in the simulation. The data W42' is expressed by $$W42'=W4+2\times B42 \qquad (13).$$

When the value of the design dimension W4 of the assist patterns 12 is 70 nm, and the gap D2 between the assist patterns 12 and the main patterns 10 is 100 nm, based on the above-described simulation result, the bias value B42 is, e.g., 0 nm, and the value of W42' is, e.g., 70 nm.

When a design value of the dimension of the assist patterns 12 is W1, and the gap between the assist patterns 12 and the main patterns 10 is D3, a value W13' given by adding a bias value B13 to the design value W1 of the dimension of the assist patterns 12 is used as data of the dimension of the assist patterns 12 in the simulation. The data W13' is expressed by $$W13'=W1+2\times B13 \quad (14).$$

When the value of the design dimension W1 of the assist patterns 12 is 40 nm, and the gap D3 between the assist patterns 12 and the main patterns 10 is 120 nm, based on the above-described simulation result, the bias value B13 is, e.g., 1 nm, and the value of W13' is, e.g., 42 nm.

When a design value of the dimension of the assist patterns 12 is W2, and the gap between the assist patterns 12 and the main patterns 10 is D3, a value W23' given by adding a bias value B23 to the design value W2 of the dimension of the assist patterns 12 is used as data of the dimension of the assist patterns 12 in the simulation. The data W23' is expressed by $$W23'=W2+2\times B23 \quad (15).$$

When the value of the design dimension W2 of the assist patterns 12 is 50 nm, and the gap D3 between the assist patterns 12 and the main patterns 10 is 120 nm, based on the above-described simulation result, the bias value B23 is, e.g., 1 nm, and the value of W23' is, e.g., 52 nm.

When a design value of the dimension of the assist patterns 12 is W3, and the gap between the assist patterns 12 and the main patterns 10 is D3, a value W33' given by adding a bias value B33 to the design value W3 of the dimension of the assist patterns 12 is used as data of the dimension of the assist patterns 12 in the simulation. The data W33' is expressed by $$W33'=W3+2\times B33 \quad (16).$$

When the value of the design dimension W3 of the assist patterns 12 is 60 nm, and the gap D3 between the assist patterns 12 and the main patterns 10 is 120 nm, based on the above-described simulation result, the bias value B33 is, e.g., 0 nm, and the value of W33' is, e.g., 60 nm.

When a design value of the dimension of the assist patterns 12 is W4, and the gap between the assist patterns 12 and the main patterns 10 is D3, a value W43' given by adding a bias value B43 to the design value W4 of the dimension of the assist patterns 12 is used as data of the dimension of the assist patterns 12 in the simulation. The data W43' is expressed by $$W43'=W4+2\times B43 \quad (17).$$

When the value of the design dimension W4 of the assist patterns 12 is 70 nm, and the gap D3 between the assist patterns 12 and the main patterns 10 is 120 nm, based on the above-described simulation result, the bias value B43 is, e.g., 0 nm, and the value of W43' is, e.g., 70 nm.

The simulation is made, using data given by adding a bias value to a design dimension of the assist patterns 12 as data of the assist patterns 12, whereby the patterns to be transferred to the wafer (photoresist film) can be given.

As described above, according to the present embodiment, data given by adding a bias value to a design dimension of the assist patterns 12 is used as the data of the dimension of the assist patterns 12, whereby the simulation can be made with high accuracy. The data of the bias value 12 is prepared not only based on a dimension of the assist patterns 12, but also in consideration of a gap between the assist patterns 12 and the main patterns 10, whereby the simulation can be made with high accuracy, and the fitting error can be made very small.

A FOURTH EMBODIMENT

Figure 11A:
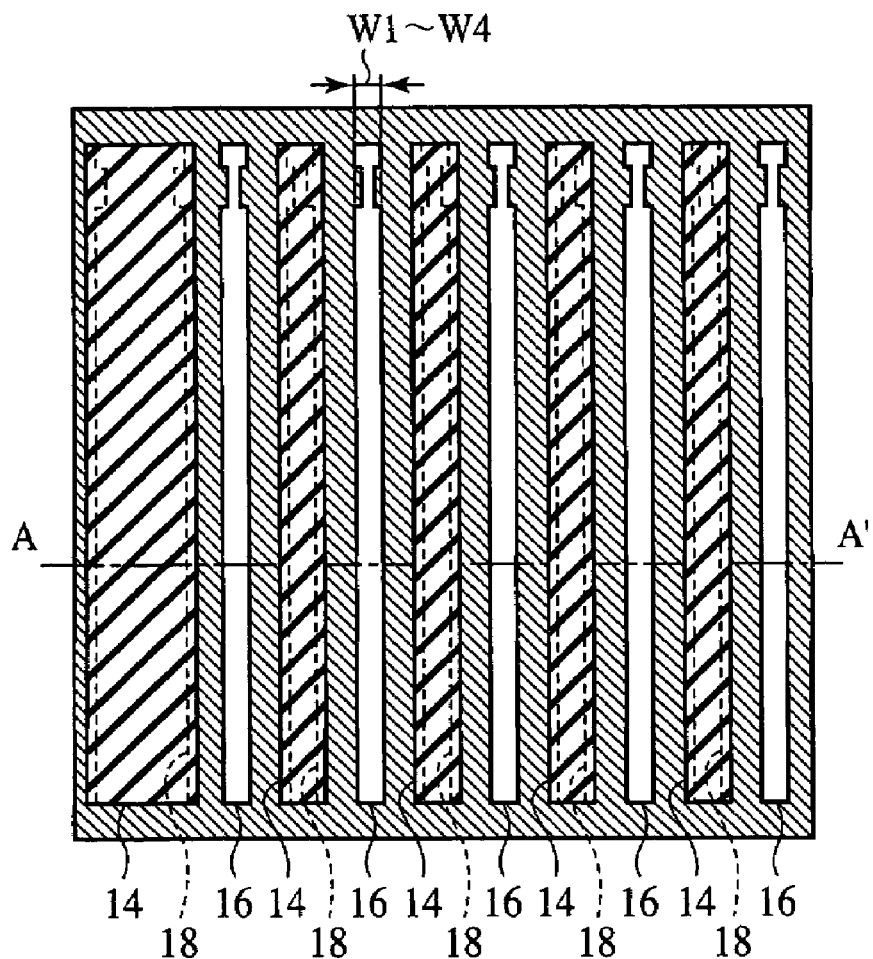
FIGS. 11A and 11B are a plan view of patterns formed on a photomask (Part 5).
Figure 11B:
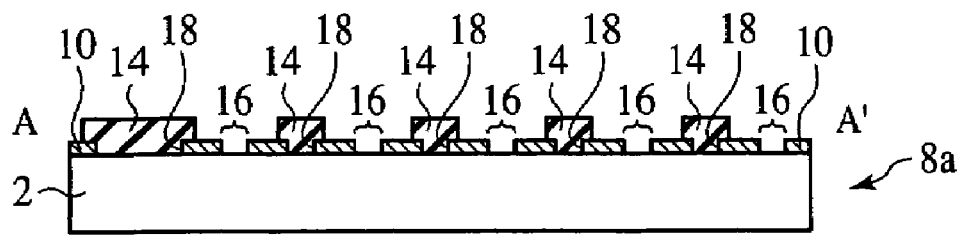

The simulation method according to a fourth embodiment of the present invention will be explained with reference to FIGS. 11A to 12. FIGS. 11A and 11B illustrate a plan view and a sectional view of patterns formed on a photomask. FIG. 12 is a view of a data table of the bias value. The same members of the present embodiment as those of the simulation method according to the first to the third embodiment illustrated in FIGS. 1 to 10 are represented by the same reference numbers not to repeat or to simplify their explanation.

The simulation method according to the present embodiment is characterized mainly in that the principle of the present invention is applied to transferring patterns by using a Levenson-type phase shift mask.

As illustrated in FIGS. 11A and 11B, a light shielding film 10 of chrome or others is formed on a substrate 2 of quartz or others. In the light shielding film 10, first openings 16 with no phase shifters 14 provided, and second openings 18 with phase shifters 14 provided in are alternately formed. The phase shifters 14 are for shifting a phase of light (light path length of light). In such Levenson-type phase shift mask 8a, when a phase of light which has passed through the first openings 16 to arrive at the wafer (photoresist film) is 0, a phase of light which has passed through the second openings 18 to arrive at the wafer (photoresist film) is n. The adjacent patterns have the phase inverted, whereby the transfer can be made with high resolution.

First, bias values corresponding to dimensions of the openings 16 and 18 are given by the simulation as follows.

For example, a bias value $B1_{(o)}$ for a design value W1 of the dimension of a first opening 16 is given in advance by, e.g., simulation. FIG. 12 is a view of a data table of the bias value. As illustrated in FIG. 12, when a design value W1 of the dimension of the first opening 16 is, e.g., 80 nm, the bias value $B1_{(o)}$ is, e.g., −6 nm.

For example, a bias value $B2_{(o)}$ for a design value W2 of the dimension of the first opening 16 is given in advance by, e.g., simulation. As illustrated in FIG. 12, when a design value W2 of the dimension of the first opening 16 is, e.g., 100 nm, the bias value $B2_{(o)}$ is, e.g., −5 nm.

For example, a bias value $B3_{(o)}$ for a design value W3 of the dimension of the first opening 16 is given in advance by, e.g., simulation. As illustrated in FIG. 12, when a design value W3 of the dimension of the first opening 16 is, e.g., 150 nm, the bias value $B3_{(o)}$ is, e.g., −4 nm.

For example, a bias value $B4_{(o)}$ for a design value W4 of the dimension of the first opening 16 is given in advance by, e.g., simulation. As illustrated in FIG. 12, when a design value W4 of the dimension of the first opening 16 is, e.g., 200 nm, the bias value $B4_{(o)}$ is, e.g., −3 nm.

For example, a bias value $B1_{(n)}$ for a design value W1 of the dimension of a second opening 18 is given in advance by, e.g., simulation. As illustrated in FIG. 12, when a design value W1 of the dimension of the second opening 18 is, e.g., 80 nm, the bias value $B1_{(n)}$ is, e.g., −5 nm.

For example, a bias value $B2_{(n)}$ for a design value W2 of the dimension of the second opening 18 is given in advance by, e.g., simulation. As illustrated in FIG. 12, when a design value W2 of the dimension of the second opening 18 is, e.g., 100 nm, the bias value $B2_{(n)}$ is, e.g., −4 nm.

For example, a bias value $B3_{(n)}$ for a design value W3 of the dimension of the second opening 18 is given in advance by, e.g., simulation. As illustrated in FIG. 12, when a design value W3 of the dimension of the second opening 18 is, e.g., 150 nm, the bias value $B3_{(o)}$ is, e.g., −3 nm.

For example, a bias value $B4_{(n)}$ for a design value W4 of the dimension of the second opening 18 is given in advance by, e.g., simulation. As illustrated in FIG. 12, when a design value W4 of the dimension of the second opening 18 is, e.g., 200 nm, the bias value $B4_{(n)}$ is, e.g., −2 nm.

As shown in FIG. 12, as the dimension (width) of the openings becomes smaller, the bias value becomes smaller. As the dimension (width) of the openings becomes smaller, the absolute value of the bias value becomes larger.

Data of the thus given bias values $B1(0)$ to $B4_{(o)}$, $B1_{(n)}$ to $B4_{(n)}$ are stored as a data table in, e.g., the hard disc device of the simulator.

Then, the simulation is made, using data given by adding the bias values to the design dimensions of the openings 16, 18 as data of the dimensions of the opening 16, 18. That is, the simulation is made to give what patterns will be formed on the wafer when the patterns are transferred to the wafer (photoresist film) 12 with an actually formed photomask.

For example, when a design value of the dimension of the first opening 16 is W1, a value given by adding a bias value to the design value W1 of the dimension of the first opening 16 is used in the simulation as data $W1_{(o)}'$ of the dimension of the first opening 16. The data $W1_{(o)}'$ is expressed by $$W1_{(o)}' = W1 + 2 \times B1_{(o)} \qquad (18).$$

When a value of the design value W1 of the dimension of the first opening 16 is, e.g., 80 nm, as shown in FIG. 12, a value of the bias value $B1_{(o)}$ is, e.g., −6 nm, and a value of $W1_{(o)}'$ is, e.g., 68 nm.

When a design value of the dimension of the first opening 16 is W2, a value given by adding a bias value to the design value W2 of the dimension of the first opening 16 is used in the simulation as data $W2_{(o)}'$ of the dimension of the first opening 16. The data $W2_{(o)}'$ is expressed by $$W2_{(o)}' = W2 + 2 \times B2_{(o)} \qquad (19).$$

When a value of the design value W2 of the dimension of the first opening 16 is, e.g., 100 nm, as shown in FIG. 12, a value of the bias value $B2_{(o)}$ is, e.g., −5 nm, and a value of $W2_{(o)}'$ is, e.g., 90 nm.

When a design value of the dimension of the first opening 16 is W3, a value given by adding a bias value to the design value W3 of the dimension of the first opening 16 is used in the simulation as data $W3_{(o)}'$ of the dimension of the first opening 16. The data $W3_{(o)}'$ is expressed by $$W3_{(o)}' = W3 + 2 \times B3_{(o)} \qquad (20).$$

When a value of the design value W3 of the dimension of the first opening 16 is, e.g., 150 nm, as shown in FIG. 12, a value of the bias value $B3_{(o)}$ is, e.g., −4 nm, and a value of $W3_{(o)}'$ is, e.g., 142 nm.

When a design value of the dimension of the first opening 16 is W4, a value given by adding a bias value to the design value W4 of the dimension of the first opening 16 is used in the simulation as data $W4_{(o)}'$ of the dimension of the first opening 16. The data $W4_{(o)}'$ is expressed by $$W4_{(o)}' = W4 + 2 \times B4_{(o)} \qquad (21).$$

When a value of the design value W4 of the dimension of the first opening 16 is, e.g., 200 nm, as shown in FIG. 12, a value of the bias value $B4_{(o)}$ is, e.g., −3 nm, and a value of $W4_{(o)}'$ is, e.g., 194 nm.

When a design value of the dimension of the second opening 18 is W1, a value given by adding a bias value to the design value W1 of the dimension of the second opening 18 is used in the simulation as data $W1_{(n)}'$ of the dimension of the second opening 18. The data $W1_{(n)}'$ is expressed by $$W1_{(n)}' = W1 + 2 \times B1_{(n)} \qquad (22).$$

When a value of the design value W1 of the dimension of the second opening 18 is, e.g., 80 nm, as shown in FIG. 12, a value of the bias value $B1_{(n)}$ is, e.g., −5 nm, and a value of $W1_{(n)}'$ is, e.g., 70 nm.

When a design value of the dimension of the second opening 18 is W2, a value given by adding a bias value to the design value W2 of the dimension of the second opening 18 is used in the simulation as data $W2_{(n)}'$ of the dimension of the second opening 18. The data $W2_{(n)}'$ is expressed by $$W2_{(n)}' = W2 + 2 \times B2_{(n)} \qquad (23).$$

When a value of the design value W2 of the dimension of the second opening 18 is, e.g., 100 nm, as shown in FIG. 12, a value of the bias value $B2_{(n)}$ is, e.g., −4 nm, and a value of $W2_{(n)}'$ is, e.g., 92 nm.

When a design value of the dimension of the second opening 18 is W3, a value given by adding a bias value to the design value W3 of the dimension of the second opening 18 is used in the simulation as data $W3_{(n)}'$ of the dimension of the second opening 18. The data $W3_{(n)}'$ is expressed by $$W3_{(n)}' = W3 + 2 \times B3_{(n)} \qquad (24).$$

When a value of the design value W3 of the dimension of the second opening 18 is, e.g., 150 nm, as shown in FIG. 12, a value of the bias value $B3_{(n)}$ is, e.g., −3 nm, and a value of $W3_{(n)}'$ is, e.g., 144 nm.

When a design value of the dimension of the second opening 18 is W4, a value given by adding a bias value to the design value W4 of the dimension of the second opening 18 is used in the simulation as data $W4_{(n)}'$ of the dimension of the second opening 18. The data $W4_{(n)}'$ is expressed by $$W4_{(n)}' = W4 + 2 \times B4_{(n)} \qquad (25).$$

When a value of the design value W4 of the dimension of the second opening 18 is, e.g., 200 nm, as shown in FIG. 12, a value of the bias value $B4_{(n)}$ is, e.g., −2 nm, and a value of $W4_{(n)}'$ is, e.g., 196 nm.

Thus, the simulation is made by using data given by adding bias values to data of the design dimensions of the openings 16, 18 as data of the openings 16, 18 to thereby give patterns to be transferred to the wafer (photoresist film).

As described above, according to the present embodiment, the simulation is made, using data given by adding bias values to design dimensions of the openings 16, 18 as dimensions of the openings 16, 18, whereby the simulation can be made with high accuracy, and the fitting error can be made very small.

A FIFTH EMBODIMENT

Figure 13:
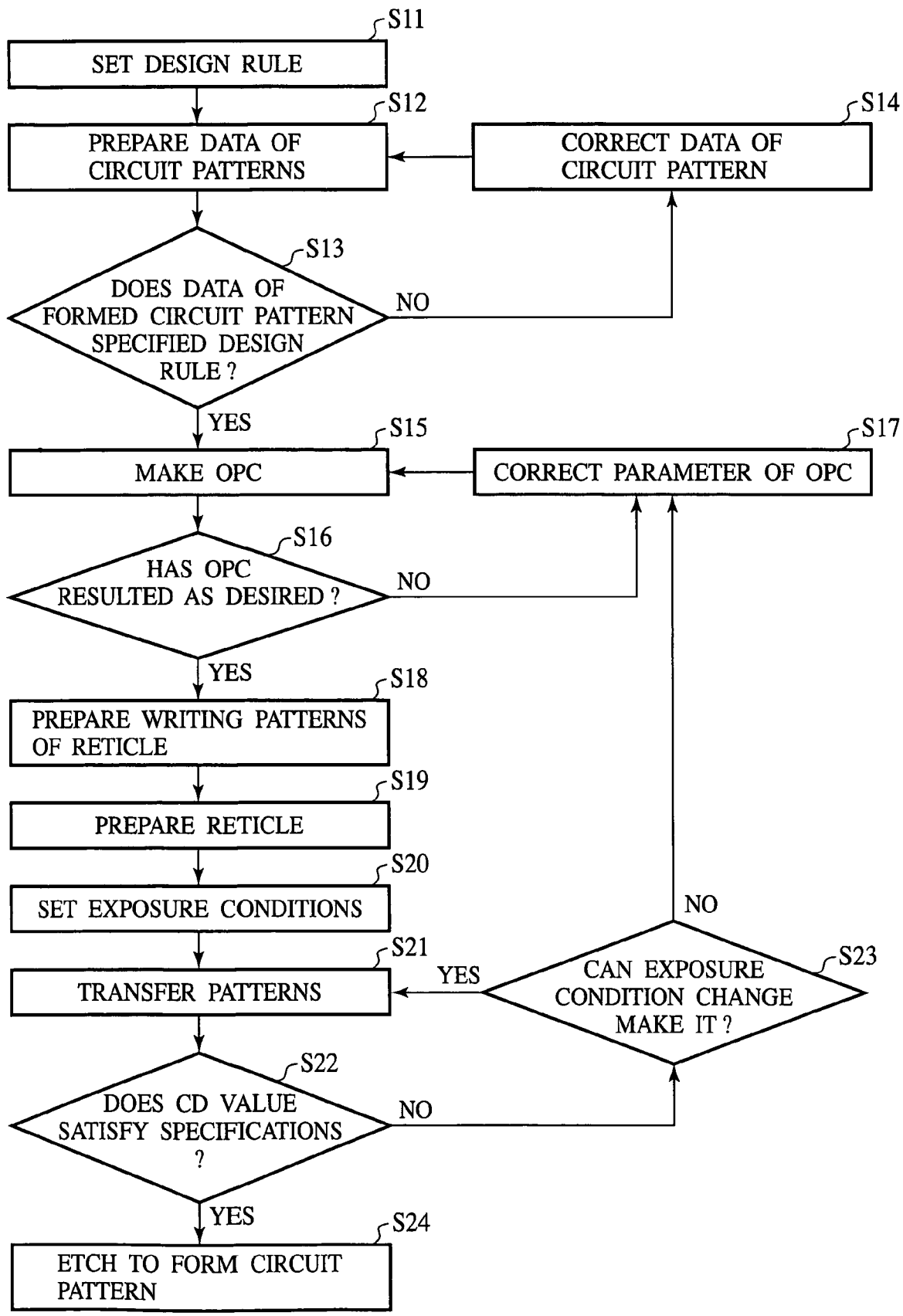
FIG. 13 is the flow chart of the semiconductor device fabrication method according to a fifth embodiment of the present invention.

The semiconductor device fabrication method according to the present embodiment will be explained with reference to FIG. 13. FIG. 13 is the flow chart of the semiconductor device fabrication method according to the present embodiment. The same member of the present embodiment as those of the simulation method according to the first to the fourth embodiment illustrated in FIGS. 1 to 12 are represented by the same reference numbers not to repeat or to simplify their explanation.

The semiconductor device fabrication method according to the present embodiment is characterized mainly in that the simulation method according to any one of the first to the fourth embodiments described above is suitably used in the OPC (Optical Proximity effect Correction).

First, design rules are set in advance (Step S11).

Next, data of circuit patterns are prepared (Step S12). In preparing the data of the circuit patterns, it should be noted to satisfy stipulated design rules.

Then, it is detected whether or not the prepared data of the circuit patterns satisfy the stipulated design rules (Step S13).

When the prepared data of the circuit patterns do not satisfy the stipulated design rules, the data of the circuit patterns are corrected (Step S14).

Then, it is again detected whether or not the corrected data of the circuit patterns satisfy the stipulated design rules (Step S13). This operation is repeated until the data of the circuit patterns satisfy the stipulated design rules.

When the prepared data of the circuit patterns have come to satisfy the stipulated design rules, the OPC (Optical Proximity effect Correction) is made (Step S15). In the OPC the simulation method according to any one of the first to the fourth embodiments is suitably used.

Next, it is detected whether or not a result of the OPC is a desired result (Step S16).

When the result of the OPC is not the desired result, parameters of the OPC are corrected (Step S17).

The OPC is made again, using the corrected parameters of the OPC (Step S16). This operation is repeated until a result of the OPC satisfies the desired result. In the present embodiment, the simulation method according to any one of the first to the fourth embodiments is used, which makes the processing for causing a result of the OPC to satisfy the desired result very short. Thus, according to the present embodiment, the OPC can be made very efficiently.

When a result of the OPC satisfies the desired result, drawn patterns of a reticle is prepared (Step S18).

Then, the patterns of the reticle are drawn to thereby prepare the reticle (Step S19). Thus, the reticle is prepared based on the data given by the OPC.

Next, exposure conditions are set (Step S20).

Then, the patterns formed in the reticle are transferred to a photoresist film (Step S21). Then, the photoresist film is developed.

Then, it is detected whether or not line widths of the developed resist patterns, more specifically, CD (Critical Dimension) values satisfy the specifications (Step S32). The CD values are dimensional values of widths of and gaps between the lines of micronized patterns, positions of the patterns, etc. The CD value are used in controlling parameters, such as an exposure, developing conditions, etching conditions, etc., dimensions of products, etc.

When the CD values of the developed resist patterns do not satisfy the specifications, the exposure conditions are changed (Step S23).

Often, the exposure condition change cannot make the CD values of the resist patterns satisfy the specifications. In such case, the parameters of the OPC are again corrected (Step S17), the OPC is made again (Step S15), and the above-described operation is again made.

When the CD values of the developed resist patterns have come to satisfy the specifications, conduction films, etc. (not illustrated) on a wafer (not illustrated) are etched with the resist pattern as the mask (Step S24). Thus, the circuit patterns including the conduction films, etc. is formed.

Although not illustrated in FIG. 13, the circuit patterns which have been formed are inspected. In the inspection, when the CD values of the circuit patterns do not satisfy the specifications, it will be due to the parameters, etc. of the OPC, and the processing, etc. of the OPC are reviewed. In this case, the wafer having the above-described circuit patterns cannot be again used, and another wafer is used anew.

Thus, the semiconductor device is fabricated.

As described above, according to the present embodiment, in the OPC, the simulation-method according to any one of the first to the fourth embodiments is used, whereby micronized interconnection patterns, etc. can be formed efficiently with a desired accuracy. Thus, according to the present embodiment, micronized semiconductor devices of high performance can be fabricated with high yields.

MODIFIED EMBODIMENTS

The present invention is not limited to the above-described embodiments and can cover other various modifications.

For example, in the above-described embodiments, the simulation is made, using dimensions on a wafer, but the simulation is not made essentially by using dimensions on a wafer. In the reduction projection exposure, a dimension on a wafer and a dimension on a photomask are different from each other. For example, the simulation may be made using a dimension on a photomask.

In the fourth embodiment, the bias value is set based on only design dimensions of the openings 16, 18, but the bias value may be set based on the gap between the first opening 16 and the second opening 18.

In the fifth embodiment, for the OPC (Optical Proximity effect Correction), the simulation method according to any one of the first to the fourth embodiments, but the simulation method according to the first to the fourth embodiments is usable not only in the OPC, but also suitably in other processing.

What is claimed is:

1. A photomask fabrication method comprising:
   simulating a pattern to be transferred onto a photoresist film by exposure using a photomask with main patterns and an assist pattern arranged between the main patterns formed on, wherein a determined operation uses data given by adding a bias value to a design dimension of the assist pattern as data of a dimension of the assist pattern, the assist pattern is a pattern separate from the main patterns, and the bias value is added to only the design dimension of the assist pattern,
   said method further comprises setting a parameter of optical proximity effect correction based on a result of the simulating, and
   fabricating the photomask based on corrected data given by the optical proximity effect correction, the bias value being not added to the corrected data.

2. The photomask fabrication method according to claim 1, wherein the bias value is set based on the design dimension of the assist pattern.

3. The photomask fabrication method according to claim 2, wherein the bias value is set to be larger as the design dimension of the assist pattern is smaller.

4. The photomask fabrication method according to claim 1, wherein the bias value is set based on a gap between the main pattern and the assist pattern, and the design dimension of the assist pattern.

5. The photomask fabrication method according to claim 4, wherein the bias value is set to be larger as the gap between the main pattern and the assist pattern becomes smaller, and is set to be longer as the design dimension of the assist pattern becomes smaller.

6. A photomask fabrication method comprising:
simulating patterns to be transferred onto a photoresist film by exposure using a Levenson-type phase shift mask having a first opening and a second opening provided with phase shifter alternately laid out, wherein a determined operation uses data given by adding a first bias value to data of a design dimension of the first opening as data of a dimension of the first opening, and data given by adding a second bias value to a design dimension of the second opening as data of a dimension of the second opening,
said method further comprises setting a parameter of optical proximity effect correction based on a result of the simulating, and
fabricating the photomask based on corrected data given by the optical proximity effect correction, the first bias value and the second bias value being not added to the corrected data.

7. The photomask fabrication method according to claim 6, wherein
the first bias value is set based on the design dimension of the first opening, and
the second bias value is set based on the design dimension of the second opening.

8. The photomask fabrication method according to claim 7, wherein
an absolute value of the first bias value is set to be larger as the design dimension of the first opening is smaller, and
an absolute value of the second bias value is set to be larger as the design dimension of the second opening is smaller.

9. The photomask fabrication method according to claim 6, wherein
the first bias value is set based on a gap between the first opening and the second opening, and
the second bias value is set based on a gap between the first opening and the second opening.

* * * * *